(12) United States Patent
Yang et al.

(10) Patent No.: US 6,759,705 B2
(45) Date of Patent: Jul. 6, 2004

(54) PLATINUM-RHODIUM STACK AS AN OXYGEN BARRIER IN AN INTEGRATED CIRCUIT CAPACITOR

(75) Inventors: Haining Yang, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/268,482

(22) Filed: Oct. 10, 2002

(65) Prior Publication Data

US 2003/0052356 A1 Mar. 20, 2003

Related U.S. Application Data

(62) Division of application No. 09/751,810, filed on Dec. 28, 2000, now Pat. No. 6,524,867.

(51) Int. Cl.[7] ............................................. H01L 27/108
(52) U.S. Cl. ....................................... 257/309; 257/534
(58) Field of Search .................................. 257/309, 534

(56) References Cited

U.S. PATENT DOCUMENTS

| | | | |
|---|---|---|---|
| 5,504,041 A | 4/1996 | Summerfelt | 437/235 |
| 5,576,928 A | 11/1996 | Summerfelt et al. | 361/321.1 |
| 5,619,393 A | 4/1997 | Summerfelt et al. | 361/321.1 |
| 5,622,893 A | 4/1997 | Summerfelt et al. | 438/396 |
| 5,729,054 A | 3/1998 | Summerfelt et al. | 257/751 |
| 5,807,774 A | 9/1998 | Desu et al. | |
| 5,844,318 A | 12/1998 | Sandhu et al. | 257/774 |
| 5,874,364 A * | 2/1999 | Nakabayashi et al. | 438/3 |
| 5,945,767 A * | 8/1999 | Westlund | 310/306 |
| 5,963,835 A | 10/1999 | Sandhu et al. | 438/681 |
| 5,989,338 A | 11/1999 | DeBoer et al. | 117/84 |
| 6,090,701 A * | 7/2000 | Hasunuma et al. | 438/632 |
| 6,177,351 B1 | 1/2001 | Beratan et al. | |
| 6,188,097 B1 * | 2/2001 | Derderian et al. | 257/306 |
| 6,281,543 B1 * | 8/2001 | Al-Shareef et al. | 257/309 |
| 6,297,527 B1 * | 10/2001 | Agarwal et al. | 257/306 |
| 6,482,736 B1 * | 11/2002 | Basceri et al. | 438/650 |
| 6,596,583 B2 * | 7/2003 | Agarwal et al. | 438/255 |

OTHER PUBLICATIONS

Kodas et al. "*The Chemistry of Metal CVD*" (Jan. 1994) Chapter 8, pp. 397–398 and 408.

Koops et al. "*Fabrication and Characterization of Platinum Nanocrystalline Material Grown By Electron–Beam Induced Deposition*"—J. Vac. Sci. Technol. B 13(6), Nov./Dec. 1995, pp. 2400–2403.

Aoyama et al. "*Ru Electrode Deposited by Sputtering in $Ar/O_2$ Mixture Ambient*"—J. Appl. Phys. vol. 37 (1998) pp. 5701–5707.

Aoyama et al. "Interfacial Layers Between Si and Ru Films Deposited in $Ar/O_2$ Mixture Ambient"—1998 Publication Board, Japanese Journal of Applied Physics, pp. L242–244.

* cited by examiner

*Primary Examiner*—Allan R. Wilson
(74) *Attorney, Agent, or Firm*—Knobbe Martens Olson & Bear, LLP

(57) ABSTRACT

The present invention relates to an electrically conductive film stack for semiconductors and methods and apparatus for providing same. A film stack comprising a first layer of a platinum-rhodium alloy deposited by metal organic chemical vapor deposition (MOCVD) in the presence of a reducer, such as hydrogen ($H_2$) gas, and a second layer of the platinum-rhodium alloy deposited in the presence of an oxidizing gas, such as ozone ($O_3$), provides an electrical conductor that is also a relatively good barrier to oxygen. The platinum-rhodium film stack can be used as an electrode or capacitor plate for a capacitor with a high-k dielectric material. The electrode formed with alternating reducing and oxidizing agents produces a rough surface texture, which enhances the memory cell capacitance.

8 Claims, 4 Drawing Sheets

PLATINUM-RHODIUM STACK AS AN OXYGEN BARRIER IN AN INTEGRATED CIRCUIT CAPACITOR

RELATED APPLICATION

This application is a divisional application of U.S. application Ser. No. 09/751,810, entitled "PLATINUM-RHODIUM STACK AS AN OXYGEN BARRIER," filed Dec. 28, 2000 now U.S. Pat. No. 6,524,867.

BACKGROUND OF THE INVENTION

1. Field of the Invention

The present invention is generally related to semiconductor fabrication. In particular, the present invention relates to a conductive metal film stack in a semiconductor.

2. Description of the Related Art

Electrical conductors are a fundamental part of integrated circuits. Electrical conductors can be used to connect devices and form conductive films that, in turn, can also be used as electrodes in a capacitor that is used to store charge in a memory cell. Preferably, integrated circuit capacitors feature a relatively large amount of capacitance in a small geometry to preserve space on the chip.

Conventional techniques for shrinking capacitor geometries include processing steps that increase the area of electrodes used as capacitor plates and include the use of high-k materials for the dielectric.

Desirable characteristics for a conductive film include relatively good conductivity and relatively good resistance to the diffusion of oxygen. Relatively good conductivity allows a relatively low contact string resistance to a device. Relatively good resistance to the diffusion of oxygen provides protection to sensitive materials, particularly where the fabrication includes formation of high-k dielectric materials. Typical high-k dielectric materials, such as barium strontium titanate (BST) ($Ba_xSr_{1-x}TiO_3$), are rich in oxygen. A highly oxidizing environment is typically required during formation of such high-k dielectric materials. Additionally, oxygen can diffuse from the high-k dielectric material after deposition, leaving conductive leakage paths in the dielectric as well as oxidizing neighboring materials.

In the past, various metals and alloys have been deposited as electrical conductors. For example, platinum (Pt) is one metal that is frequently deposited. However, films formed from platinum provide a relatively poor barrier to oxygen and allow underlying layers to oxidize. For example, if the platinum is deposited directly on silicon (Si), the diffused oxygen can result in the conversion of silicon (Si) to silicon dioxide ($SiO_2$), which in turn results in an increase in the contact string resistance to the affected device. In another example, where platinum is deposited on a layer of tantalum that is used as an adhesion layer, the diffused oxygen can convert the tantalum (Ta) to an oxide of tantalum, thereby reducing the conductivity of the original tantalum adhesion layer.

SUMMARY OF THE INVENTION

Embodiments of the present invention provide an electrically conductive film stack for semiconductors and methods and apparatus for providing the same. The film stack can be used either as a conductor itself or in conjunction with another conductor. Advantageously, the film stack can form an oxygen barrier that substantially prevents the loss of oxygen from high-k (high dielectric constant) dielectric material and prevents oxidation of neighboring materials, such as silicon (Si). The film stack can be deposited on a three-dimensional structure, such as a wall of a high-k metal-insulator-metal (MIM) capacitor, to form an electrode for the capacitor. The electrode formed by the film stack includes graining, which enhances the surface area of the electrode and thereby increases the capacitance of the capacitor.

One process according to an embodiment of the present invention deposits an electrode for a metal-insulator-metal capacitor. The electrode serves as both an electrically conductive plate for the capacitor as well as an oxygen barrier, thereby protecting neighboring materials. The electrode is deposited in multiple layers. A first layer of the multiple layers is a layer of platinum-rhodium (Pt-Rh) alloy deposited in a metal organic chemical vapor deposition (MOCVD) process in the presence of an oxidizer. A second layer of the platinum-rhodium alloy is deposited on the first layer in the presence of a reducer. A third layer of the platinum-rhodium alloy is deposited on the second layer, again in the presence of an oxidizer.

Another process according to an embodiment of the present invention deposits a metallic film stack on a substrate. A first film is deposited with a reducer and a second film of a similar composition is deposited on the first film with an oxidizer.

In another process according to an embodiment of the present invention, the process deposits a metallic film stack by alternating between depositing a layer in the presence of a reducing agent, and depositing a layer in the presence of an oxidizing agent, while using the same metal source gas(es) during both steps. The depositing of layers can be repeated to build up a thickness of the film stack.

One system according to an embodiment of the present invention provides a MOCVD system that is adapted to alternately introduce an oxidizing reactant gas and a reducing reactant gas. A plurality of vaporizers can prepare organometallic platinum and organometallic rhodium for introduction to the deposition chamber via a relatively inert gas, such as argon (Ar) or helium (He).

One embodiment of the present invention includes a platinum-rhodium alloy capacitor plate that is deposited on a substrate. The capacitor plate includes a rough texture to enhance the capacitance of the capacitor cell. Preferably, one surface of the capacitor plate exhibits hemispherical grains with an average size of about 50 Angstroms (Å) to about 1000 Å, and more preferably of about 100 Å to about 500 Å. It will be understood by one of ordinary skill in the art that an optimal area enhancement through the HSG Pt-Rh will vary depending on the geometry of the capacitor. Preferably, the platinum-rhodium alloy is about 5% to 50% rhodium by atomic ratio. More preferably, the platinum-rhodium alloy is about 10% to 40% rhodium by atomic ratio. Additionally, the capacitor plate is preferably from about 50 Å to about 1000 Å thick. More preferably, the capacitor plate is about 100 Å to about 600 Å thick. Advantageously, the capacitor plate provides a barrier to oxygen, thereby substantially preventing the oxidation of neighboring materials and allowing the use of high-k dielectrics.

Another embodiment according to the present invention includes a metal-insulator-metal integrated circuit capacitor. In the metal-insulator-metal capacitor, at least one of the plates or electrodes is made from a platinum-rhodium alloy. The platinum-rhodium alloy plate advantageously includes a grainy surface that faces the dielectric, and further advantageously provides an oxygen barrier for the dielectric.

Preferably, the dielectric is a relatively high-k material with a relative permittivity of at least 5, or more preferably at least 10. In one embodiment, the dielectric material selected is from tantalum oxide ($Ta_2O_5$) and barium strontium titanate (BST) ($Ba_xSr_{1-x}TiO_3$).

BRIEF DESCRIPTION OF THE DRAWINGS

These and other features of the invention will now be described with reference to the drawings summarized below. These drawings and the associated description are provided to illustrate preferred embodiments of the invention, and not to limit the scope of the invention.

DETAILED DESCRIPTION OF PREFERRED EMBODIMENTS

Although this invention will be described in terms of certain preferred embodiments, other embodiments that are apparent to those of ordinary skill in the art, including embodiments which do not provide all of the benefits and features set forth herein, are also within the scope of this invention. Accordingly, the scope of the present invention is defined only by reference to the appended claims.

Embodiments of the present invention include multiple layer film stacks of platinum-rhodium alloy that can be used in semiconductor fabrication. The multiple layer film stacks can include from 2 layers to many layers of platinum-rhodium alloy film. Alternating layers of platinum-rhodium alloy film are deposited in reducing and oxidizing environments, respectively. The film stack conducts electricity and can be used, for example, as an electrode in a capacitor. In addition, the film stack advantageously provides an oxygen barrier, which can, for example, substantially inhibit the oxidation of neighboring materials, particularly when employed in conjunction with high-k materials.

While referred to herein as a film "stack," due to the different steps employed to deposit the material, the skilled artisan will appreciate that the layers within the stack are all of a similar composition. In the illustrated embodiment, this means that the entire stack comprises a platinum-rhodium (Pt-Rh) alloy, although individual layers within the stack can exhibit slightly different ratios of component metals.

Figure 1:
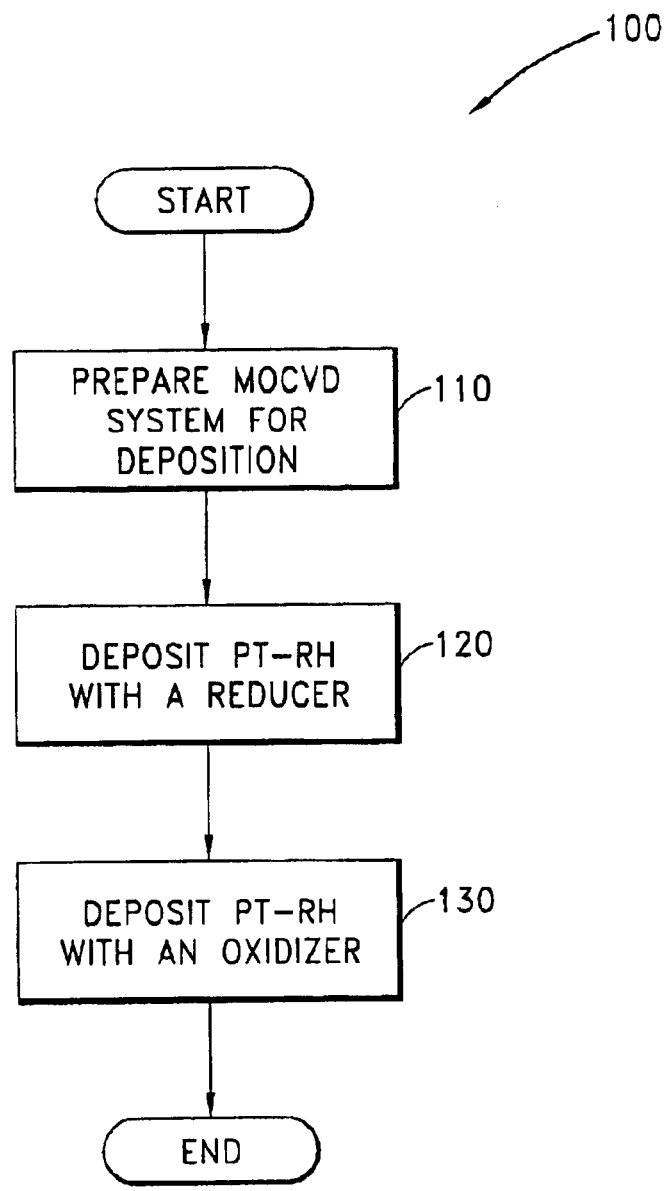
FIG. 1 is a flowchart, generally illustrating a process for producing a 2-layer film stack.

FIG. 1 illustrates a process 100 according to one embodiment of the present invention for producing a 2-layer film stack. In State 110, a substrate is introduced to a deposition chamber of a deposition system and the system prepares for deposition. The substrate can include a single wafer for a single wafer deposition system, or can include multiple wafers in a batch wafer deposition system. One embodiment of the process 100 is a metal organic chemical vapor deposition (MOCVD) process. Other terms used in the literature to describe MOCVD include organo-metal vapor phase epitaxy (OMVPE) and metal organic vapor phase epitaxy (MOVPE).

Figure 4:
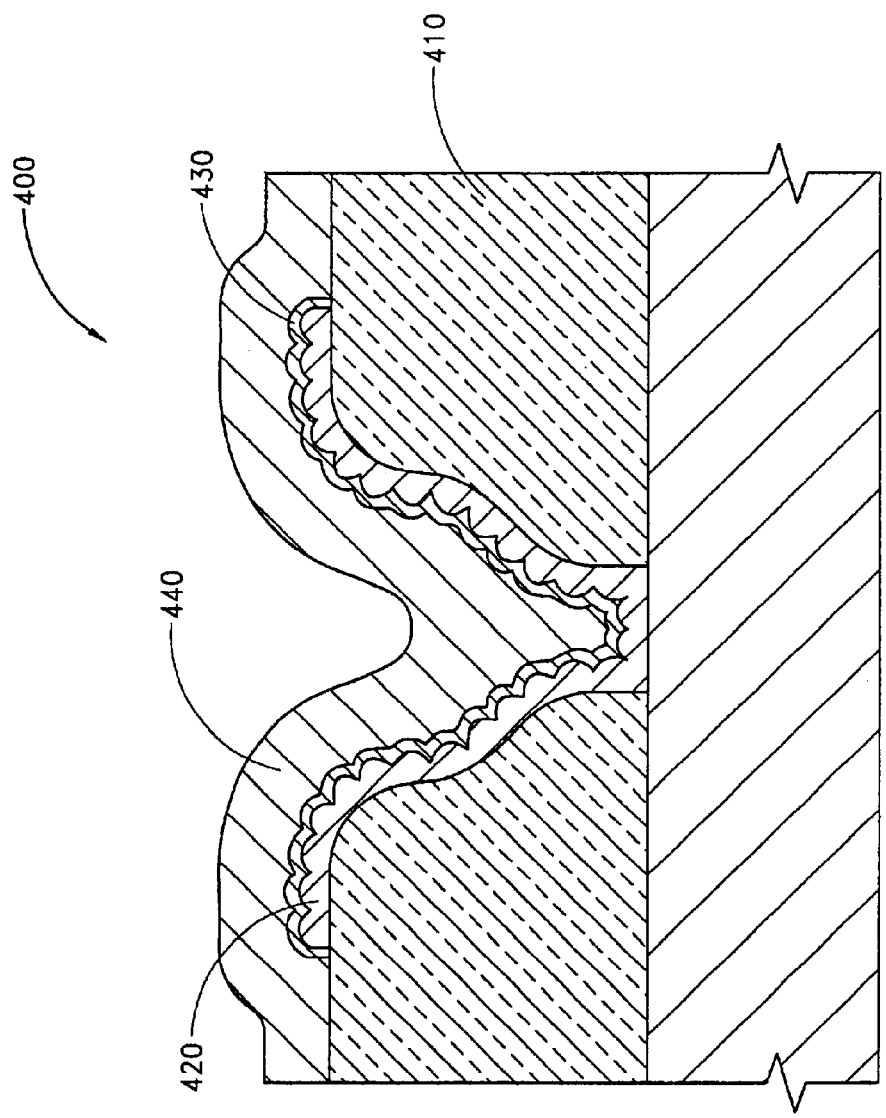
FIG. 4 is a cross-sectional view of a capacitor according to an embodiment of the present invention, where a rough film stack forms an electrode of the capacitor.

The substrate can conform to a variety of physical geometries, including substantially planar geometries or complex three-dimensional structures, such as those that are used to fabricate capacitors (see, e.g., FIG. 4 and accompanying text).

State 110 further includes aspects of a MOCVD process that are well known to those of ordinary skill in the art. For example, the temperature of the deposition chamber, or at least the temperature of the substrate, is preferably maintained within a range of approximately 150 degrees Celsius (C.) to 550 degrees C. More preferably, the temperature is maintained within a range of approximately 200 degrees C. to 500 degrees C. One embodiment maintains a temperature of about 450 degrees C. Typical sources for heat include radiant heat from tungsten halogen lamps or ultraviolet sources, inductive heating, resistance heating, etc. Typical MOCVD chamber pressures, such as between 0.1 Torr and 100 Torr, can be used. The process advances from State 110 to State 120.

In State 120, the system deposits a first layer of platinum and rhodium on the substrate with a reducer. It will be understood by one of ordinary skill in the art that the first layer can be deposited directly on a substrate, such as silicon, or can be deposited on another layer that is already present on the substrate, such as an adhesion layer of titanium nitride (TiN) or tantalum (Ta).

The sources for platinum and rhodium are introduced to the deposition chamber in a gas vapor phase. The gas vapor phase of platinum can be obtained by heating an organometallic platinum precursor, such as $Pt(acac)_2$, in a vaporizer and using an inert gas, such as argon (Ar) or nitrogen ($N_2$), to carry the organometallic platinum precursor to the deposition chamber. Similarly, the gas vapor phase of rhodium can be introduced to the deposition chamber by heating an organometallic rhodium precursor, such as $Rh(CO)_2(acac)$, in a vaporizer and carrying the organometallic rhodium precursor to the deposition chamber with an inert gas. It will be understood by one of ordinary skill in the art that the flow rate of the carrier gases will depend on the size of the deposition chamber. Examples of flow ranges include about 10 standard cubic centimeters per minute (SCCM) to about 1000 SCCM.

The relative gas flow rates between the carrier gas with the platinum precursor and the carrier gas with the rhodium precursor control the relative ratio of platinum to rhodium in the deposited film. Preferably, the gas flow rates are maintained such that the deposited platinum-rhodium alloy film comprises from about 5% to about 50% rhodium as measured by atomic ratio. More preferably, the gas flow rates are adjusted so that the deposited platinum-rhodium alloy comprises from about 10% to about 40% rhodium. In one embodiment, the gas flow rates are adjusted so that the platinum-rhodium alloy is about 70/30 platinum to rhodium. One embodiment of the system provides for the adjustment of the relative gas flows of platinum and rhodium carrier gases, by gas flow valves and the like, so that the ratio of platinum to rhodium can be configured to conform to design choice. One embodiment of the system includes mass flow controllers under software control, where the software is programmed to maintain the flow of the source gases for platinum and rhodium, and to select among reactant gases, including oxidizing reactant gases and reducing reactant gases.

In addition, in State 120, the platinum-rhodium alloy is deposited in the presence of a reducing gas or reducer. Examples of sources for the reducing gas include hydrogen ($H_2$) and ammonia ($NH_3$). The reducing gases can be used alone, or in combination. Depositing in the presence of a reducing atmosphere results in a relatively slow deposition rate. While the deposition rate with an oxidizer is generally higher than the deposition rate with a reducer, the inventors have found pronounced advantages to processes that include a reducing agent in at least one phase.

Preferably, the deposition of a platinum-rhodium alloy film in the presence of a reducing gas continues until the thickness of the film is from about 20 Angstroms (Å) to about 500 Å. The process advances from State 120 to State 130.

In State 130, the process continues to deposit the platinum-rhodium alloy, but in the presence of an oxidizing gas or oxidizer. The source for the reducing gas is substantially cut-off and instead, an oxidizing gas is introduced to the deposition chamber. Examples of source gases that can be used as the oxidizing gas include oxygen ($O_2$), ozone ($O_3$), nitrous oxide ($N_2O$), hydrogen peroxide ($H_2O_2$), steam ($H_2O$), and nitric oxide (NO). The oxidizing gases can be used alone, or in combination. Preferably, deposition of a platinum-rhodium alloy film in the presence of an oxidizing gas continues until the thickness of the film is from about 20 Angstroms (Å) to about 500 Å.

Advantageously, the deposition of the platinum-rhodium alloy films described above in States 120 and 130 can be accomplished in one recipe, i.e., without removing the substrate from the deposition chamber, by switching reducer flow to oxidizer flow and maintaining the flow of the metal source gases. Preferably, the total thickness of a 2-layer film stack deposited by the process 100 is from about 50 Å to about 2000 Å thick. More preferably, the film stack is from about 100 Å to about 1000 Å thick. It will be understood by one of ordinary skill in the art that the film stack referenced above can form a portion of a larger structure. For example, the film stack may be deposited on top of a silicon (Si) substrate directly, or may be deposited on a layer or layers that have already been deposited on the substrate, such as, for example, a layer of titanium nitride (TiN) or a layer of platinum (Pt). Further, additional layers can be deposited on top of the film stack. For example, a layer of ruthenium oxide ($RuO_2$) can be deposited on top of the film stack.

Advantageously, the 2-layer film stack of platinum-rhodium alloy is both electrically conductive and a barrier to oxygen. The platinum-rhodium alloy typically exhibits a resistivity of 30 microohm-centimeters ($\mu\Omega$-cm). The electrical conductivity allows the film stack to be used to connect to devices, such as transistors. In addition, electrical conductivity allows a film stack to form at least a portion of an electrode for a capacitor. The capacitor can store charge, and hence, can be used to form part of a memory device such as a dynamic read only memory (DRAM) chip.

Further, the combination of deposition with a reducer and deposition with an oxidizer results in a 2-layer film stack that forms a relatively good barrier to oxygen. The barrier to oxygen can substantially prevent the diffusion of oxygen during formation and annealing of a high-dielectric constant material, such as barium strontium titanate (BST) ($Ba_xSr_{1-x}TiO_3$). Oxidation of neighboring materials, such as underlying silicon (Si), is undesirable because the silicon (Si) converts to silicon dioxide ($SiO_2$), which increases the contact string resistance of the associated component or device. Reduction of BST is undesirable because the BST dielectric converts to conductive metallics, which discharge the charge stored in the capacitor through leakage. Advantageously, a 2-layer film stack produced in accordance with the process 100 described above can substantially prevent the unintended diffusion of oxygen and preserves neighboring materials.

In addition, the 2-layer film stack deposited by alternating the reducer and the oxidizer results in a rough surface texture. The grain size achieved by alternating the reducer and the oxidizer is from about 100 Å to about 500 Å.

A rough surface has a relatively larger surface area than a smooth surface. In a capacitor, a larger surface area is desirable because the capacitance of a capacitor is approximately proportional to the effective surface area of the electrodes. An electrode according to an embodiment of the present invention exhibits a 70 to 100% increase in surface area compared with a substantially planar surface. By providing a method to increase the relative capacity of a capacitor, a geometry of the capacitor can be decreased for a given amount of capacitance and more capacitors can be fabricated in a given area of substrate. Advantageously, relatively larger and more reliable memory devices can be fabricated and/or the same memory size devices can be fabricated on a smaller portion of substrate. Examples of dielectric materials that can be used to fabricate a capacitor include tantalum oxide ($Ta_2O_5$) and barium strontium titanate (BST) ($Ba_xSr_{1-x}TiO_3$). Beneficially, an electrode according to an embodiment of the present invention further provides an oxygen barrier so that a high-k dielectric, such as $Ta_2O_5$ or BST can be used, thereby combining the benefits of a high-k dielectric and a relatively large surface area.

By contrast, typical methods to increase the relative surface area of a deposited film involve silicon electrodes, which are easily oxidized. For example, in a conventional system, a layer of polysilicon can be made hemispherical grain (HSG), over which layers of metallization are deposited.

Embodiments of the present invention obviate the need to specially prepare the surface by providing a method of producing a grainy film stack on a smooth surface. In addition, the surfaces to which a film stack can be deposited include both substantially flat surfaces as well as 3-dimensional surfaces, as can be found in a trench of etched substrate material.

The process 100 can be repeated multiple times so that a film stack includes multiple layers of platinum-rhodium alloy deposited with alternating reducing agents and oxidizing agents. Preferably, the resulting film stack, with multiple layers deposited by repeating the process 100, is from about 50 Å to about 2000 Å thick. More preferably, the film stack is from about 100 Å to about 1000 Å thick. Preferably, a layer in the film stack is from about 20 Å to about 500 Å thick.

Figure 2:
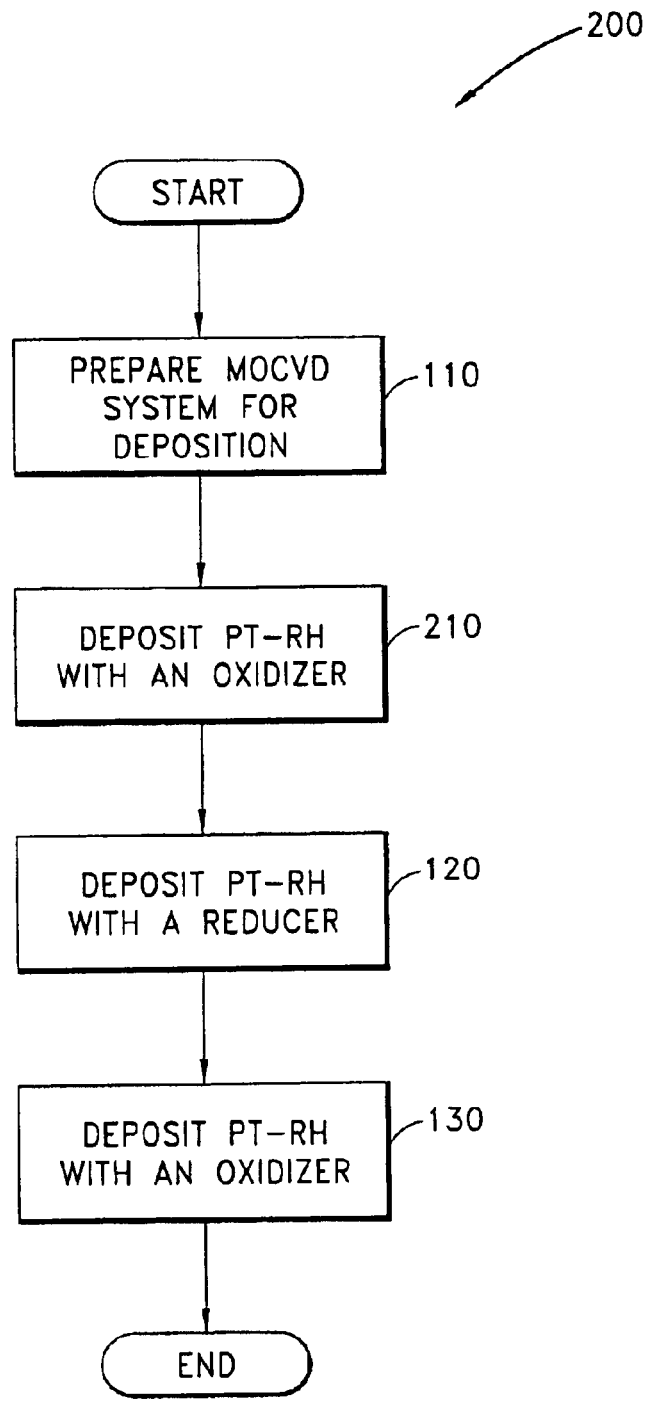
FIG. 2 is a flowchart, generally illustrating a process for producing a 3-layer film stack.

FIG. 2 illustrates a process 200 according to an embodiment of the present invention of alternating multiple films deposited with reducing agents and oxidizing agents. In the process 200 shown in FIG. 2, a 3-layer film stack is deposited on a substrate. In sequence, the process 200 comprises the States 110, 210, 120, and 130.

In State 110, a substrate is introduced to a deposition chamber of a deposition system and the system prepares for deposition. Further details of State 110 are described above in connection with FIG. 1. The process advances from State 110 to State 210.

In State 210, the process 200 deposits a layer of platinum-rhodium alloy in the presence of an oxidizing gas. As described above in connection with State 130 of the process 100 illustrated in FIG. 1, the oxidizing gas can include gases such as oxygen ($O_2$), ozone ($O_3$), nitrous oxide ($N_2O$), hydrogen peroxide ($H_2O_2$), steam ($H_2O$), and nitric oxide (NO). Preferably, the deposition of a platinum-rhodium alloy film in State 210 continues until the thickness of the film is from about 20 Å to about 500 Å. The process advances from State 210 to State 120.

In State 120, the process 200 deposits a layer of platinum and rhodium with a reducer. The layer deposited in State 120 is deposited on top of the layer of platinum-rhodium alloy that was deposited with the oxidizer in State 210. Further details of State 120 are described above in connection with FIG. 1. Preferably, the deposition of a platinum-rhodium alloy film in State 120 continues until the thickness of the film is from about 20 Å to about 500 Å. The process advances from State 120 to State 130.

In State 130, the process deposits the platinum-rhodium alloy with an oxidizer on top of the layer of platinum-rhodium alloy that was deposited with the reducer in State 120. Further details of State 130 are described above in connection with FIG. 1. Again, the deposition of a platinum-rhodium alloy film that is deposited in the presence of an oxidizing gas in State 130 preferably continues until the thickness of the film is from about 20 Angstroms (Å) to about 500 Å.

Advantageously, the deposition of the multiple layer platinum-rhodium alloy film stack produced by the process 200 described in connection with FIG. 2 can be accomplished in one recipe, i.e., without removing the substrate from the deposition chamber, by switching reducer flow to oxidizer flow and vice-versa while maintaining the flow of other source gases. Preferably, the total thickness of a 3-layer film stack deposited by the process 200 is again from about 50 Å to about 2000 Å thick. More preferably, the film stack is from about 100 Å to about 1000 Å thick. The 3-layer film stack produced by the process 200 again possesses the benefits of providing electrical conductivity and of providing a barrier to oxygen.

Figure 3:
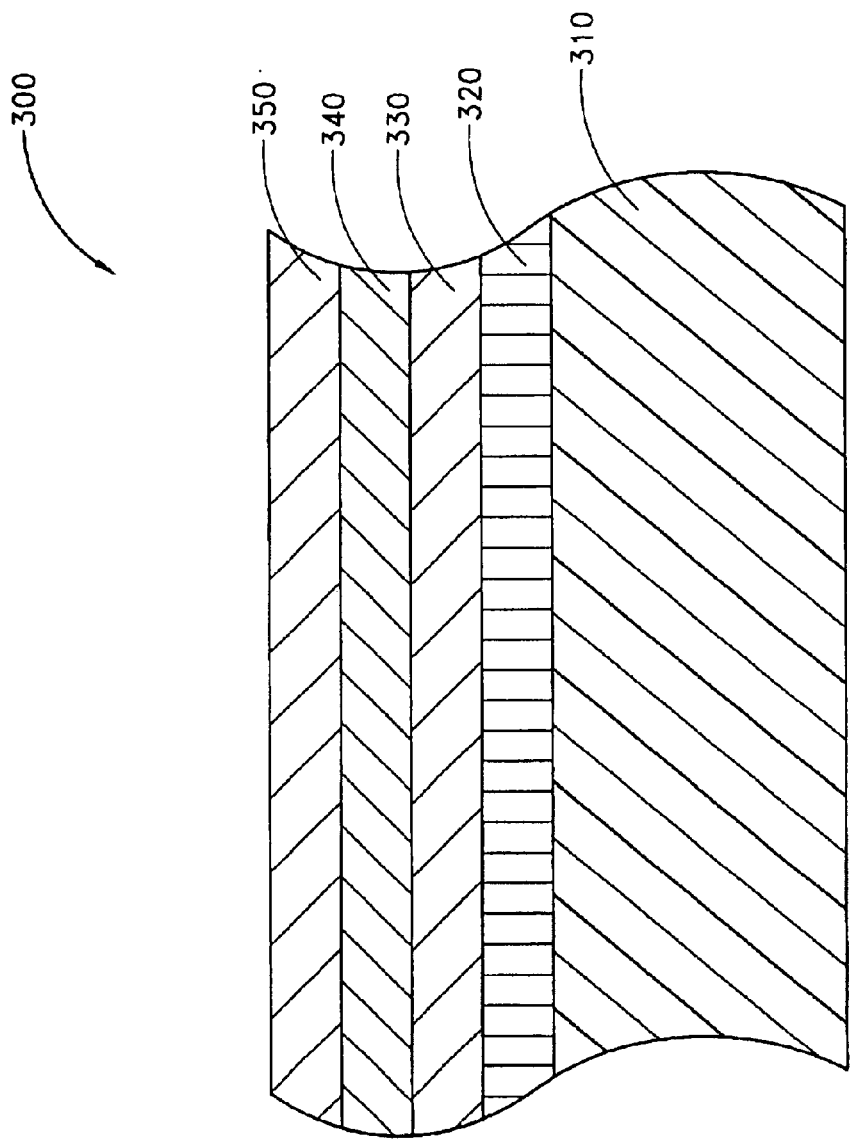
FIG. 3 is a schematic cross-sectional view of a 3-layer film stack on a substrate according to an embodiment of the present invention.

FIG. 3 illustrates a cross-sectional view of a 3-layer film stack 300 deposited on a substrate 310 according to an embodiment of the present invention. The film stack 300 can be deposited on an optional adhesion layer 320, which can be fabricated from, for example, a layer of titanium nitride (TiN) or tantalum (Ta). The adhesion layer 320 is deposited on the substrate 310. Where the adhesion layer 320 is not used, the film stack 300 can be deposited on the substrate 310 or on a contact plug. The film stack can also be deposited on a dielectric and used as a top electrode.

A first layer 330 of the film stack is deposited on the adhesion layer 320. The first layer 330 can be deposited in accordance with State 210 of the process 200, i.e., deposited with an oxidizer. Preferably, the first layer 330 is from about 20 Å to about 500 Å thick.

A second layer 340 of the film stack is deposited on the first layer 330. The second layer 340 can be deposited in accordance with State 120 of the process 200, i.e., deposited with a reducer. Preferably, the second layer 340 is from about 20 Å to about 500 Å thick.

A third layer 350 of the film stack is deposited on the second layer 340. The third layer 350 can be deposited in accordance with State 130 of the process 200, i.e., deposited with an oxidizer. Preferably, the third layer 350 is from about 20 Å to about 500 Å thick.

In one embodiment, the total film stack thickness, i.e., the sum of the thickness of the first, the second, and the third layers, 330, 340, 350 is from about 50 Å to about 2000 Å thick. Preferably, the total film stack thickness is from about 100 Å to about 1000 Å thick.

In one embodiment, the deposited films 330, 340, 350 of the film stack comprise an alloy of platinum and rhodium. Preferably, the platinum-rhodium alloy ranges from about 5% to about 50% rhodium by atomic ratio. More preferably, the platinum-rhodium alloy ranges from about 10% to about 40% rhodium as measured by atomic ratio. One embodiment of the film stack 300 uses the same ratio of platinum to rhodium in the films. Of course, the ratio of platinum to rhodium can be easily varied between deposition of the layers if so desired, by, for example, manipulating the carrier gas flow rates.

It will be understood by one of ordinary skill in the art that other embodiments of the film stack include 2-layer film stacks and multiple layer film stacks. The 3-layer film stack 300 shown in FIG. 3 merely represents one possible configuration of a film stack according to an embodiment of the present invention.

FIG. 4 illustrates one embodiment of the present invention of a metal-insulator-metal capacitor 400, where a film stack forms an electrode of the capacitor 400. The capacitor 400 can serve to store charge for a cell of a memory device, such as a cell of a DRAM. It will be understood by one of ordinary skill in the art that many configurations for the capacitor are possible. For example, one embodiment according to the present invention includes a stack capacitor formed above transistors, where the stack capacitor is formed by creating a hole or well in a thick insulator, and lining the hole with electrode layers and dielectric layers.

In the illustrated embodiment, the capacitor 400 shown in FIG. 4 is formed within a trench that is etched into the substrate 410. A first plate or first electrode 420 is formed on the substrate. In one embodiment of the capacitor 400, the first electrode 420 is a film stack deposited in accordance with an embodiment of the present invention, such as the film stack 300 shown in FIG. 3.

A dielectric layer 430 is formed on top of the first electrode 420. Examples of materials for the dielectric layer include barium strontium titanate (BST) ($Ba_xSr_{1-x}TiO_3$), tantalum oxide ($Ta_2O_5$), silicon nitride ($Si_3N_4$), silicon dioxide ($SiO_2$), zirconium oxide ($ZrO_2$), hafnium oxide ($HfO_2$), niobium oxide ($Nb_2O_5$) and others. Preferably, the dielectric material used in a capacitor according to an embodiment of the present invention has a k value (relative permittivity) greater than about 5, and more preferably, has a k value greater than about 10.

A second electrode 440 is formed on top of the dielectric layer 430. In one embodiment, both the first and the second electrodes 420, 440 conform to film stacks produced in accordance with an embodiment of the present invention. In another embodiment, only one of the first or the second electrodes 420, 440 conform to film stacks produced in accordance with an embodiment of the present invention.

Various embodiments of the present invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

What is claimed is:

1. A rough capacitor plate in an integrated circuit, comprising platinum-rhodium alloy electrically connected to an active area of an underlying substrate, where a surface of the capacitor plate includes a rough surface texture, wherein the surface has hemispherical grains with an average size between about 50 Å and about 1000 Å.

2. The capacitor plate as defined in claim 1, wherein the surface has hemispherical grains with an average size between about 100 Å and about 500 Å.

3. A rough capacitor plate in an integrated circuit, comprising platinum-rhodium alloy electrically connected to an active area of an underlying substrate, where a surface of the capacitor plate includes a rough surface texture, wherein about 5% to 50% of the platinum-rhodium alloy is rhodium.

4. The capacitor plate as defined in claim 3, wherein about 10% to 40% of the platinum-rhodium alloy is rhodium.

5. A metal-insulator-metal integrated circuit capacitor, comprising:
   a first plate of platinum-rhodium alloy electrically connected to an active area of an underlying substrate, wherein a surface of the first plate of platinum-rhodium alloy facing the dielectric has hemispherical grains with an average size between about 50 Å and about 1000 Å;
   a second plate; and
   a dielectric disposed between the first plate and the second plate, where the dielectric has a relative permittivity of at least 5.

6. The capacitor as defined in claim 5, wherein the dielectric has a relative permittivity of at least 10.

7. The capacitor as defined in claim 5, wherein dielectric is selected from tantalum oxide ($Ta_2O_5$) and barium strontium titanate (BST) ($Ba_xSr_{1-x}TiO_3$).

8. The capacitor as defined in claim 5, wherein a surface of the first plate of platinum-rhodium alloy facing the dielectric has hemispherical grains with an average size between about 100 Å and about 500 Å.

\* \* \* \* \*